(12) United States Patent
Takagi et al.

(10) Patent No.: US 6,924,244 B2
(45) Date of Patent: Aug. 2, 2005

(54) METAL COATED FIBER MATERIALS

(75) Inventors: Susumu Takagi, Fukui (JP); Shigekazu Orita, Fukui (JP); Hiroo Kishimoto, Fukui (JP); Hidemasa Araie, Fukui (JP)

(73) Assignee: Seiren Co., Ltd., Fukui (JP)

( * ) Notice: Subject to any disclaimer, the term of this patent is extended or adjusted under 35 U.S.C. 154(b) by 167 days.

(21) Appl. No.: 09/731,935

(22) Filed: Dec. 7, 2000

(65) Prior Publication Data

US 2001/0019928 A1 Sep. 6, 2001

(30) Foreign Application Priority Data

Dec. 7, 1999  (JP) ............................................. 11-348210

(51) Int. Cl.$^7$ .......................... D03D 25/00; D03D 15/00

(52) U.S. Cl. ...................... 442/181; 442/189; 442/193; 442/192; 442/195

(58) Field of Search ................................. 442/192, 195, 442/189, 193

(56) References Cited

U.S. PATENT DOCUMENTS 3,470,928 A  * 10/1967  Schwartz ........................ 150/1
6,147,017 A  * 11/2000  Fastenau et al. ............. 442/192
6,387,523 B2 *  5/2002  Bunyan et al. ............... 428/457

* cited by examiner

*Primary Examiner*—Glenn Caldarola
*Assistant Examiner*—Alexis Wachtel
(74) *Attorney, Agent, or Firm*—Dilworth & Barrese LLP

(57) ABSTRACT

A flexible electrically conductive fabric is obtained by plating a fabric constructed of multifilament yarn composed of a plural flat thermoplastic singlefilaments.

13 Claims, 2 Drawing Sheets

METAL COATED FIBER MATERIALS

FIELD OF THE INVENTIONS

This invention relates to an electrically conductive fiber material suitable for use as electromagnetic interference (EMI) shielding, grounding and other electrically conductive parts.

BACKGROUND OF THE INVENTION

Electrically conductive fabrics have been widely used in various electronic apparatus to prevent leakage of electromagnetic waves from the apparatus. Among them is fabric of synthetic fiber, made of polymer material such as polyester or nylon, with a metal coating formed on its surface, which is characterized by its two combined characteristics—flexibility from its fiber component and EMI shielding performance from its metal component—finding wide application in the field of gaskets and tapes to be built into electronic apparatus.

The recent development of electronic apparatus reduced in size and increased in frequency has required the development of electrically conductive materials, such as EMI shielding and grounding materials, smaller in thickness and more effective especially in a high frequency region. It is known that metal foil and polymer film coated with metal by deposition or spattering meet these requirements. Such materials, however, have the disadvantages of being lacking in durability, flexibility and softness, which are properties required for their use as EMI shielding and other electrically conductive materials.

JP64-30899A discloses a non-woven fabric for use as an EMI shielding sheet material obtained by bonding a metal plated fiber with a flat cross-section and a thermally melting binder fiber together by melting of said binder fiber. However, this non-woven fabric bases its improved shielding performance on the thermal compression binding of the thermally melting binder fiber to the metal plated fiber, which adversely affects its flexibility and also requires extra steps making its manufacture expensive.

JP8-291432A discloses a flexible woven fabric effective in shielding EMi obtained from a metal monofilament with a flat non-round section spirally wound onto a core yarn composed of 10 or more fibers. This fabric, however, has the disadvantage of requiring an increased amount of the metal monofilament to obtain a satisfactory EMI shielding effect, which, in turn, adversely influences its flexibility, as well as its cost performance.

OBJECT OF THE INVENTION

The present invention has been made against the background of the prior art involving the above-mentioned technical problems. It is therefore an object of the present invention to provide an electrically conductive fabric, which maintains the flexibility of its fiber substrate and has high EMI shielding performance over a broadband, finding wide application in the field of electrically conductive materials such as EMI shielding and grounding.

SUMMARY OF THE INVENTION

The present invention primarily resides in an electrically conductive fiber material which comprises a fabric constructed of multifilament yarn composed of a plurality of flat thermoplastic singlefilaments and a metal coating layer formed on the surface of the fabric.

The present invention secondarily resides in a method for producing an electrically conductive fiber material which comprises providing a fabric constructed of multifilament yarn composed of a plurality of thermoplastic flat single filaments and subjecting the fabric to a metal coating treatment.

The fabric particularly preferable in the present invention is a woven fabric. The flat singlefilament particularly preferable according to the present invention has an average flat ratio of 1.5 to 5.0. The multifilament useful in constructing the fabric of the present invention has an average compression of 1.0 to 8.0, preferably 1.2 to 7.0. The warp of useful fabric according to the present invention preferably has a fabric surface occupancy ratio of 60 to 90%, while its waft preferably has a fabric surface occupancy ratio of 90 to 120%. The fabric according to the present invention preferably has a cover factor of 1000 to 3000. The thermoplastic polymer composing the multifilament yarn of fabric useful in the present invention preferably is polyester.

PREFERRED EMBODIMENTS OF THE INVENTION

According to the present invention, fabric constructed of multifilament yarn composed of a plurality of flat thermoplastic singlefilaments is coated with metal to manufacture an electrically conductive fiber material.

The fiber material constructed of such multifilament yarn composed of flat singlefilaments according to the present invention includes, without limitation, woven fabric, knitted fabric and non-woven fabric. Among these fabrics, however, woven fabric is preferable for the present invention, because it can yield an electrically conductive material which is advantageous in thinness, high EMI shielding performance and ease of processing into secondary products.

Useful woven fabric of the present invention may be manufactured using the multifilament composed of flat singlefilaments, as referred to in the present invention, for its warp of weft alone, or both thereof, whether in part or whole. The weave of woven fabric according to the present invention includes, without limitation, plain, twill and satin, and any combination thereof. Among these weaves, however, plain weave is preferable for the present invention because it is advantageous in mechanical properties, yarn fray resistance and thinness.

The average flat ratio of a flat singlefilament useful in manufacturing electrically conductive fiber material of the present invention refers to the value determined by drawing a rectangle circumscribed along the cross-section of the flat singlefilament as illustrated in FIG. 1 and dividing the long side (L) of the rectangle by its short side (S), which is normally in the range of 1.5 to 5, preferably 2 to 4. As found in the process of the present invention, a flat singlefilament with an average flat ratio of more than 5 has a problem with its processing into multifilament yarn and fabric, while the one, whose average flat ratio is 1.5 or below, causes a problem with the flexibility of the electrically conductive fabric resulting from it. To eliminate these problems, the flat singlefilament of the present invention has a cross-section, the circumscribed rectangle of which has normally a long side (L) of 10 to 50 $\mu$m, preferably 20 to 40 $\mu$m, and a short side (S) of 2 to 30 $\mu$m, preferably 60 to 20 $\mu$m. The size of the flat singlefilament according to the present invention normally is 1 to 10 deniers (hereinafter abbreviated as "d"), preferably 2 to 5 d. A flat singlefilament with a size Less than 1 d may has a problem with its strength not sufficient for its satisfactory processing into yarn and fabric, while the one, whose size is more than 10 d, may cause a problem with the flexibility of the fabric resulting from it. The total size of the multifilament yarn composed of flat singlefilaments according to the present invention is normally 10 to 100 d, preferably 20 to 80 d.

The shape of the cross-section of singlefilament according to the present invention includes, without limitation, ellipse, rectangle, W and hourglass. Among singlefilaments with cross-sections of these shapes, however, ones with a cross-section shaped like W or hourglass are preferable for the present invention, because such a shape allows the singlefilaments to fit in closely with one another when processed into a multifilament, which, in turn, can yield a fabric smooth in surface and small in thickness, contributing to its improved flexibility and higher EMI shielding performance. The average flat ratio of a multifilament useful in constructing the electrically conductive fiber material of the present invention refers to the value determined by drawing a rectangle circumscribed along the cross-section of the multifilament as illustrated in FIG. 2 and dividing the long side (l) of the rectangle by its short side (s), which is normally in the range of 1.0 to 8.0, preferably 1.2 to 7.0. A multifilament with an average flat ratio of less than 1.0 may cause a problem of increased thickness of the resultant fabric, adversely affecting its flexibility, as well as its EMI shielding performance, while the one, whose average compression is more than 8.0, has a problem with its processing into fabric, as well as with the EMI shielding performance of the fabric.

The fabric surface occupancy ratio referred to in the present invention refers to the value determined for the warp and weft of fabric as illustrated in FIG. 4 according to the following formulas:

Fabric surface occupancy ratio (%) for warp=Warp width $(A)$/Warp pitch $(B)$×100

Fabric surface occupancy ratio (%) for weft=Weft width $(C)$/Weft pitch $(D)$×100

According to the present invention, electrically conductive fiber materials may preferably be manufactured using a fabric referred to in the present invention, the warp of which has a fabric surface occupancy ratio of 60 to 90% and the weft of which has a fabric surface occupancy ratio of 90 to 120%.

If the warp has a fabric surface occupancy ratio of less than 60%, slipping may occur, adversely affecting the EMI shielding performance of the electrically conductive material. If the warp has a fabric surface occupancy ratio of more than 90%, flattening of the weft may occur, adversely affecting the thickness of the electrically conductive material, as well as its EMI shielding performance.

If the weft has a fabric surface occupancy ratio of less than 90%, the size of openings at the intersections of the fabric would be increased, making it more subject to slipping with resultant deterioration in the EMI shielding performance of the electrically conductive material. If the weft has a fabric surface occupancy ratio of more than 120%, the thickness would be increased, affecting uniformplating of the fabric with poor penetration of a plating solution through it.

According to the present invention, fabric may be finished by calendering to enable the fabric surface occupancy ratios of its warp and weft to be held within their respective ranges specified above.

The termoplastic fiber useful in manufacturing the electrically conductive materials of the present invention includes, without limitation, polyester fiber such as polyethylene terephthalate fiber, polyamide fiber such as nylon 6 and nylon 66, and acrylic fiber. Among these fibers, however, polyester fiber is preferable for the present invention because it is advantageous in durability and ease of processing into flat singlefilament, multifilament and fabric.

The flat singlefilament of the present invention may be manufactured by methods including, but not limited to, calendering and melt spinning. Among these methods, however, the melt spinning method is preferable for the present invention because it can manufacture a singlefilament uniform in flatness. If a woven fabric is used as a substrate on which a metal coating layer is formed for manufacturing of the electrically conductive material of the present invention, usually the fabric has a cover factor of 1000 to 3000, preferably 1500 to 2500.

Fabric with a cover factor of less than 1000 may has a problem of increased size of openings at the intersections of the fabric, resulting in deteriorted EMI shielding performance of the electrically conductive material. Conversely, fabric with a cover factor of more than 3000 may has a problem not only with its awkward manufacture, but also with its poor flexibility due to its high density, which also causes poor penetration of a plating solution through it, adversely affecting the ease of its plating and the durability of the resultant metal coating formed on it.

The cover factor of woven fabric referred to in the present invention is the value determined by its design factors—total warp size (D1), warp density (N1), total weft size (D2) and weft density (N2) according to the following formula:

$$(D1)^{1/2} \times N1 + (D2)^{1/2} \times N12,$$

where the yarn size is expressed in deniers and the yarn density in yarns/inch.

Metal coating of fabric constructed of thermoplastic multifilament yarn composed of flat singlefilaments as referred to in the present invention to manufacture an electrically conductive material may be achieved by using methods such as spattering, vacuum deposition, electroplating and electroless plating that have been disclosed in various prior art references for such coating. Among these methods, however, electroless plating is preferable for the present invention because it is advantageous in that it can metal-plate fabric with formation of a metal coating at the intersections of its yarns. Electroless plating of fabric according to the present invention may be carried out according to well-known procedure which has a step of applying a catalyst to the fabric, followed by a step of its chemical plating. For the catalyst applying step, the present invention may use either of the two known methods: one is by sensitizing fabric with an aqueous solution of tin chloride, followed by treatment of the fabric with an aqueous solution of palladium chloride, and the other is by applying a one-solution catalyst of tin-palladium colloid to fabric, followed by removal of tin ions on its colloidal surface layer for exposure of palladium effective as a catalyst for its chemical plating. The chemical plating process may be performed using plating bath and conditions known by those skilled in the art. The chemical plating bath normally contains a metal salt, reducer, buffer, pH controller and other agents necessary to achieve the purpose of the present invention.

Conductive metals useful in plating fabric to manufacture electrically conductive materials of the present invention includes, without limitation, silver, copper, nickel, cobalt and tin. Among these metals, however, copper and nickel are preferable for the present invention because both metals are advantageous in providing a plating bath stable and easy to handle. The plating of fabric according to the present invention may preferably be carried out so that the thickness of the metal coating formed on the fabric is in the range of 0.05 to 5 μm.

Fabric plated with a metal coating thickness of less than 0.05 μm may fail to provide a sufficient surface conductivity to convert the fabric into an electrically conductive material referred to in the present invention. Conversely, fabric plated with a metal coating thickness of more than 5 μm may fail to show any further increase in its surface conductivity due to such a thick metal coating, which only contributes to its deteriorated flexibility.

In general, metal plating of any substrate is evaluated for a degree of metal coating formed on the substrate in terms of metal deposition per unit area or surface resistance more often than in terms of thickness. In this respect, the metal plating of fabric according to the present invention may be performed so that the fabric has a metal deposition of 5 to 50 g/m$^2$, preferably 10 to 30 g/m$^2$, and a surface resistance of 0.001 to 1Ω/□, preferably 0.01 to 0.1Ω/□.

EXAMPLES

The present invention will be understood more clearly with reference to the following Examples; however, these examples are intended to further illustrate the present invention and are not to be construed to limit the scope of the present invention.

Evaluation

The electrically conductive materials obtained according to Examples 1 and 2, and Comparative Example 1 were evaluated for three items—surface conductivity, EMI shielding performance and flexibility—according to their respective evaluation methods described below. The results of the evaluation are shown in Table 1.

1. Surface Conductivity

A resistance measuring device (Mitsubishi Chemical Corporation-made Loresta-EP MCP-T360) was used to measure each test sample for surface conductivity in Ω/□ according to the four-terminal four-probe measurement method (specified by JIS-K-7194).

2. EMI Shielding Performance

① 10 MHz to 1 GHz Region

A measuring cell similar to the one devised by Kansai Electronic Industry Development Center (KEC)'s Ikoma Testing Station was prepared to receive 10 MHz to 1 GHz generated from a spectrum analyzer with a tracking generator (Agilent Technology-made HP8591EM) at the measuring cell's receiving unit through a test specimen of the fabric set in the cell to measure its EMI shielding performance in dB over the 10 MHz to 1GHz region with the spectrum analyzer ② 1 GHz to 15 GHz Region A steel shielding box with an internally-built double rigid horn antenna (EMCO-mede EMCO3115) was prepared according to MIL-STD-285 in such a way that the box was provided with an opening on one face, over which a test specimen of the fabric was attached, to receive the radio waves of 1 GHz to 15 GHz generated with a synthesized signal generator (Agilent Technology-made HP83731A) at the internal antenna through the test specimen from another double rigid horn antenna (EMCO-made EMCO3115) at the opposite position outside the box so as to measure the specimen's EMI shielding performance in dB over the 1 GHz to 15 GHz region with a spectrum analyzer (Agilent Technology-made HP8563E).

③ Flexibility

JIS-L-1096 Method A (known as 45° Cantilever Method) was used to measure a test specimen of the fabric in mm for evaluation of its flexibility.

Example 1

A plain weave fabric with 50 denier (hereinafter abbreviated as "d")-24 filament (hereinafter abbrevited as "f") regular polyester multifilament textured yarn for its warp and 75 d-36 f polyester multifilament yarn (composed of singlefilament with a W-shaped cross-section, whose circumscribed rectangle has a long side (L) of 35 μm and a short side (S) of 15 μm—Asahi Chemical-made Technofine) for its weft was scoured, dried and heat-preset and subjected to a surface etching treatment by caustic hydrolysis for weight reduction by 10% to convert the fabric into one with a warp density of 123 yarns/inch, a weft density of 84 yarns/inch and a cover factor of 1597.

The fabric was immersed in an aqueous solution containing 0.3 g/L of palladium chloride, 30 g/L of stannous chloride and 300 ml of 36% hydrochloric acid at 40° C. and then washed with water. Thereafter, the fabric was immersed in a solution of borofluoric acid with an acid concentration of 0.1N and then washed with water. The fabric was subsequently immersed in an electroless copper plating bath consisting of 7.5 g/L of copper sulfate, 30 ml/L of 37% formalin and 85 g/L of Rochelle salt and then washed with water. The copper-plated fabric was further immersed in an electronickeling bath containing 300 g/L of nickel sulfamate, 30 g/L of boric acid and 15 g/L of nickel chloride at a pH of 3.7 with a current density of 5 A/dm$^2$ to build up a nickel layer on it before washing it with water to obtain an electrically conductive material with a metal coating layer consisting of 25 g/m$^2$ of copper and 5 g/m$^2$ of nickel. The metal coated textile material was subjected to the above-mentioned evaluation, the result of which is as shown in Table 1.

Example 2

A plain weave fabric with 30d-18 polyester multifilament yarn (composed of singlefilament with a W-shaped cross-section, whose circumscribed rectangle has a long side (L) of 35 μm and a short side (S) of 15 μm—Asahi Chemical-made Technofine) for its warp and 50d-30f polyester multifilament yarn (composed of singlefilament with a W-shaped cross-section, whose circumscribed rectangle has a long side (L) of 35 μm and a short side (S) of 15 μm—Asahi Chemical-made Technofine) for its weft was scoured, dried and heat-preset before caustic treatment for weight reduction by 10% to convert the fabric into one with a warp density of 149 yarns/inch, a weft density of 138 yarns/inch and a cover factor of 1792.

The fabric was immersed in an aqueous solution containing 0.3 g/L of palladium chloride, 30 g/L of stannous chloride and 300 ml of 36% hydrochloric acid and then washed with water. Thereafter, the fabric was immersed in a solution of borofluoric acid with an acid concentration of 0.1N and then washed with water. The fabric was subsequently immersed in an electroless copper plating bath consisting of 7.5 g/L of copper sulfate, 30 ml/L of 37% formalin and 85 g/L of Rochelle salt and then washed with water. The copper-plated fabric was further immersed in an electronickeling bath consisting of 300 g/L of nickel sulfamate, 30 g/L of boric acid and 15 g/L of nickel chloride at a pH of 3.7 with a current density of 5 A/dm$^2$ to build up a nickel layer on it before washing it with water to obtain an electrically conductive material with a metal coating layer consisting of 25 g/m$^2$ of copper and 5 g/m$^2$ of nickel. The metal coated material was subjected to the above-mentioned evaluation, the result of which is as shown in Table 1.

Comparative Example 1

A plain weave fabric with 50d-36f regular polyester multifilament textured yarn for its warp and weft was scoured, dried and heat-preset before being caustic treatment for weight reduction by 10% to convert the fabric into one with a warp density of 164 yarns/inch, a weft density of 104 yarns/inch and a cover factor of 1895.

The fabric was immersed in an aqueous solution containing 0.3 g/L of palladium chloride, 30 g/L of stannous chloride and 300 ml of 36% hydrochloric acid and then washed with water. Thereafter, the fabric was immersed in a solution of borofluoric acid with an acid concentration of 0.1N and then washed with water. The fabric was subsequently immersed in an electroless copper plating bath consisting of 7.5 g/L of copper sulfate, 30 ml/L of 37% formalin and 85 g/L of Rochelle salt and then washed with water. The copper-plated fabric was further immersed in an electronickeling bath consisting of 300 g/L of nickel sulfamate, 30 g/L of boric acid and 15 g/L of nickel chloride at a pH of 3.7 with a current density of 5 A/dm$^2$ to build up a nickel layer on it before washing it with water to obtain an electrically conductive material with a metal coating layer consisting of 20 g/m$^2$ of copper and 5 g/m$^2$ of nickel. The metal coated material was subjected to the above-mentioned evaluation, the result of which is as shown in Table 1.

TABLE 1

|  |  | Example 1 | Example 2 | Comparative Example 1 |
|---|---|---|---|---|
| Fabric thickness ($\mu$m) |  | 75 | 80 | 120 |
| Flat ratio | Warp | 2.9 | 3.6 | 2.0 |
| (%) | Weft | 5.9 | 5.0 | 3.2 |
| Fabric surface | Warp | 76 | 69 | 86 |
| occupancy ratio (%) | Weft | 92 | 119 | 70 |
| Surface conductivity ($\Omega/\Box$) |  | 0.015 | 0.036 | 0.056 |
| EMI shielding | 10 MHz | 100 | 102 | 96 |
| Performance | 50 MHz | 97 | 92 | 83 |
| (dB) | 100 MHz | 91 | 85 | 76 |
|  | 500 MHz | 83 | 76 | 66 |
|  | 1 GHz | 82 | 75 | 65 |
|  | 5 GHz | 80 | 70 | 60 |
|  | 10 GHz | 84 | 74 | 63 |
|  | 15 GHz | 78 | 74 | 63 |
| Flexibility (mm) (warp/weft) |  | 55/42 | 37/37 | 75/45 |

EFFECTS OF THE INVENTION

As can be seen from Table 1 fabric constructed of multifilament yarn composed of flat singlefilaments with an average compression of 1.5 to 5, allowing the multifilament yarn to have an average of 1.0 to 8.0, when chemically plated with metal, can yield an electrically conductive material small in thickness with a metal coating layer, whose surface is fine, uniform and smooth, maintaining the flexibility of the fabric and showing high EMI shielding performance over a wide frequency range.

LEGENDS

Figure 1:
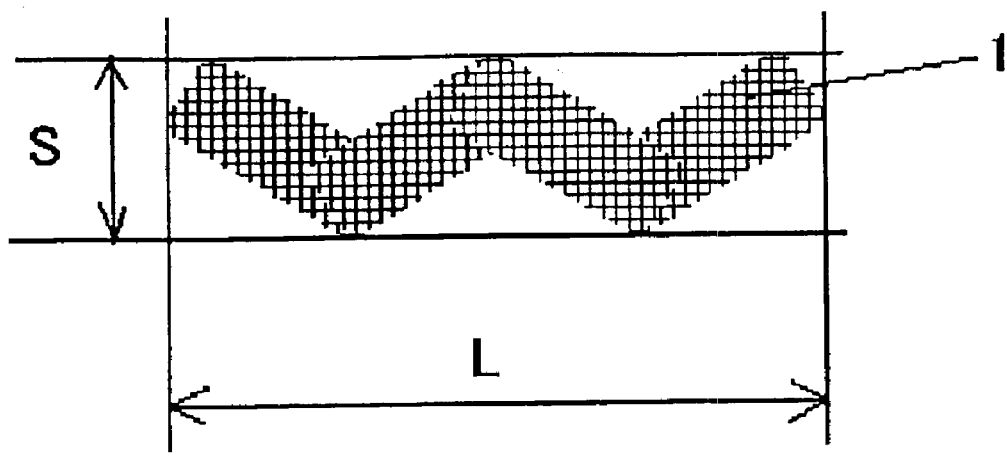
FIG. 1 is a conceptual cross-sectional view of the flat singlefilament of the present invention for calculation of its compression.
Figure 2:
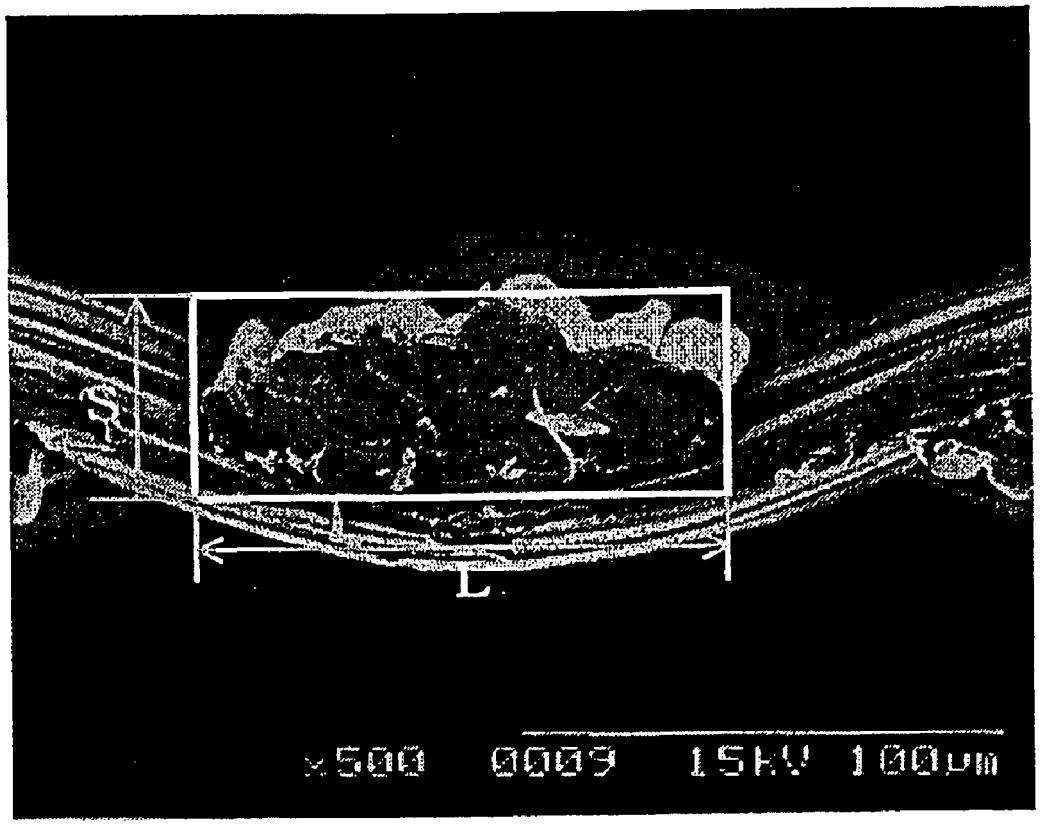
FIG. 2 is a conceptual cross-sectional view of the multifilament yarn of the present invention for calculation of its compression.
Figure 3:
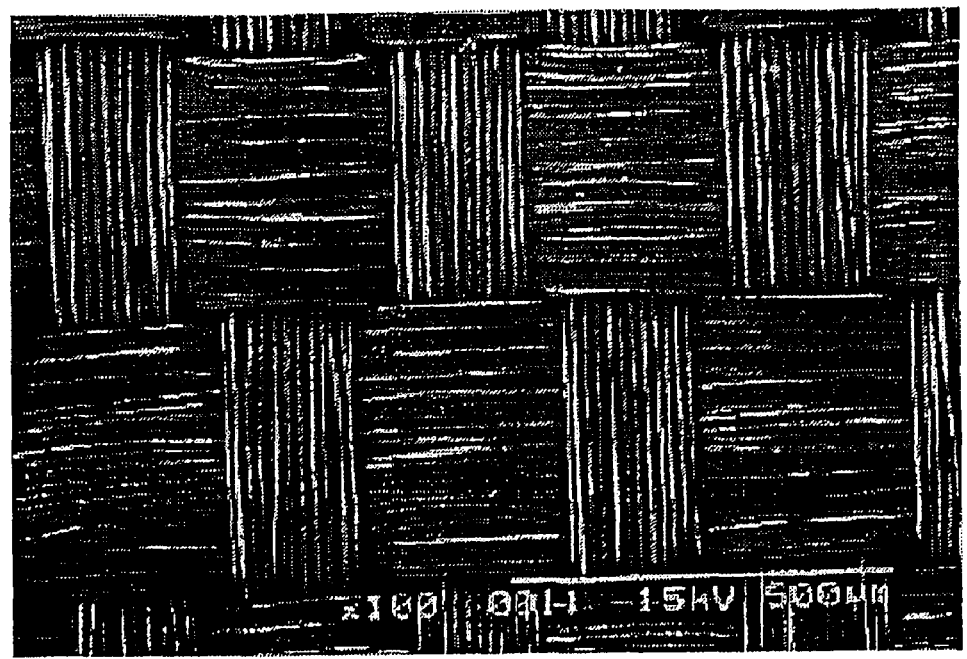
FIG. 3 is a photo showing the surface of the woven fabric used in the examples of the present invention.
Figure 4:
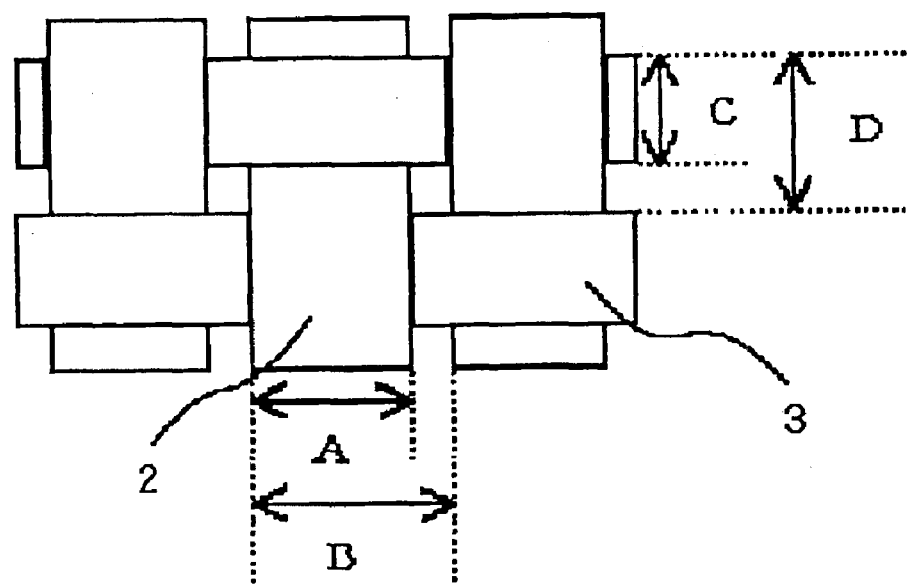
FIG. 4 is a conceptual schematic illustration of the warp and weft of the present invention for calculation of their respective fabric surface occupancy ratios.

1 . . . Singlefilament
2 . . . Warp multifilament yarn
3 . . . Weft multifilament yarn
A . . . Warp multifilament yarn width
B . . . Warp pitch
C . . . Weft multifilament yarn width
D . . . Weft pitch

What is claimed is:

1. An electrically conductive material comprising woven fabric constructed of multifilament yarn composed of a plurality of flat thermoplastic single filament and a metal coating layer formed on the surface of the fabric,
said flat single filament having an average flat ratio of 1.5 to 5.0 and having W-shaped, ellipse, rectangle or hourglass cross-section,
said multifilament yarn having an average flat ratio of 1.2 to 7.0,
said material having an EMI shielding performance of at least 70 dB in the range of 1 GHz to 15 GHz, and
the warp of said woven fabric has a fabric surface occupancy ratio of 60 to 90% and its weft has a fabric surface occupancy ratio of 90 to 120%.

2. The electrically conductive material as claimed in claim 1, wherein said woven fabric has a cover factor of 1000 to 3000.

3. The electrically conductive material as claimed in claim 1, wherein the thermoplastic fiber constituting said woven fabric is polyester fiber.

4. A method of producing an electrically conductive material which comprises providing a woven fabric constructed of multifilament yarn composed of a plurality of flat thermoplastic single filament and subjecting the fabric to a metal coating treatment by electroless plating,
said flat single filament having an average flat ratio of 1.5 to 5.0 and having W-shaped, ellipse, rectangle or hourglass cross-section,
said multifilament yarn having an average flat ratio of 1.2 to 7.0,
said material having an EMI shielding performance of at least 70 dB in the range of 1 GHz to 15 GHz, and
the warp of said woven fabric has a fabric surface occupancy ratio of 60 to 90% and its weft has a fabric surface occupancy ratio of 90 to 120%.

5. The method as claimed in claim 4, wherein said woven fabric has a cover factor of 1000 to 3000.

6. The method as claimed in claim 4, wherein the thermoplastic fiber constituting said woven fabric is polyester fiber.

7. An EMI shield consisting essentially of the electrically conductive material as claimed in claim 1.

8. The electricity conductive material as claimed in claim 1, wherein the thermoplastic fiber constituting said woven fabric is polyamide fiber.

9. The electrically conductive material as claimed in claim 8, wherein the polyamide fiber is selected from Nylon 6 or Nylon 66 fiber.

10. The electrically conductive material as claimed in claim 3, wherein the polyester fiber is polyethylene terephthalate fiber.

11. The method as claimed in claim 6, wherein the polyester fiber is polyethylene terephthalate fiber.

12. The electrically conductive material as claimed in claim 1, wherein the warp of said woven fabric has a fabric surface occupancy ratio of greater than 60% but less than 90% and its weft has a fabric surface occupancy ratio of greater than 90% but less than 120%.

13. The method of claim 4 wherein the warp of said woven fabric has a fabric surface occupancy ratio of greater than 60% but less than 90% and its weft has a fabric surface occupant ratio of greater than 90% but less than 120%.

* * * * *